United States Patent
Anand et al.

(10) Patent No.: US 6,788,591 B1
(45) Date of Patent: Sep. 7, 2004

(54) SYSTEM AND METHOD FOR DIRECT WRITE TO DYNAMIC RANDOM ACCESS MEMORY (DRAM) USING PFET BIT-SWITCH

(75) Inventors: Darren L. Anand, Essex Junction, VT (US); John E. Barth, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,909

(22) Filed: Aug. 26, 2003

(51) Int. Cl.[7] .............................................. G11C 7/00
(52) U.S. Cl. ..................... 365/190; 360/233.5; 360/203
(58) Field of Search ............................ 365/190, 233.5, 365/203, 204, 205, 63

(56) References Cited

U.S. PATENT DOCUMENTS 5,313,434 A * 5/1994 Abe ........................ 365/233.5
5,629,899 A * 5/1997 Sato ........................ 365/230.03
6,288,928 B1 * 9/2001 Shinozaki ..................... 365/63
6,400,629 B1   6/2002 Barth, Jr. et al. ........... 365/210

* cited by examiner

Primary Examiner—Gene N. Auduong
(74) Attorney, Agent, or Firm—Robert A. Walsh; Cantor Colburn LLP

(57) ABSTRACT

A control circuit for a memory array device having one or more memory storage cells associated therewith includes a true bit-line and a complementary bit-line coupled to the one or more memory storage cells. A sense amplifier is coupled to the true and complementary bit-lines, the sense amplifier being configured to amplify a small voltage difference between the true bit-line and the complementary bit-line to a full level signal at predetermined high and low logic voltage levels. A bit-switch pair selectively couples the bit-lines and said sense amplifier to fan-in circuitry, and is further configured so as to couple the fan-in circuitry to the true and complementary bit-lines prior to the activation of a wordline associated with a selected cell for a write operation thereto. Thereby, the write operation to the selected cell is commenced prior to the completion of time associated with signal development on the true and complementary bit-lines.

24 Claims, 2 Drawing Sheets

SYSTEM AND METHOD FOR DIRECT WRITE TO DYNAMIC RANDOM ACCESS MEMORY (DRAM) USING PFET BIT-SWITCH

BACKGROUND OF INVENTION

BACKGROUND

The present invention relates generally to dynamic random access memory (DRAM) devices and, more particularly, to a system and method for direct write to DRAM using PFET bit-switches.

Existing dynamic random access memories (DRAMs) are generally slower to access than static random access memory (SRAM) or read only memory (ROM). Conventionally, DRAMs gave been manufactured as "stand alone", integrated circuit chips that store large quantities of data for faster access than magnetic or optical disc media, at relatively low prices and lower power consumption. SRAMs and ROMs, by contrast, have usually provided faster access than DRAMs, but often at higher prices and higher power consumption since these memory types require a larger device count per stored data bit, which adds to cost and density.

More recently, interest has increased in using DRAMs as one of several elements of an integrated circuit, such as in an application specific integrated circuit (ASIC) that may include logic or other processing devices in addition to memory. Such DRAM devices in this context are also referred to as embedded DRAM or eDRAM. The goals of using embedded DRAM include obtaining potentially large amounts of easily rewriteable storage with fast access times, but at lower cost and power consumption than SRAMs. One problem associated with existing DRAM architectures is that it takes longer to write a memory cell with a new data bit (e.g., from logic "0" to "logic 1" or vice versa) than it takes to read or refresh the data bit in that memory cell. This longer write time in turn limits the cycle time or frequency that the DRAM can operate.

One approach taken in writing early within a memory cycle is to hold only one of either a true bit-line or the complementary bit-line at a precharge potential (e.g., ground), while setting a sense amplifier. The sense amplifier (for read or refresh) amplifies a small voltage difference between the true bit-line and the complement bit-line to predetermined high and low voltage logic levels in order to write a data bit to the cell. For write operations, one side (true or complement) of the sense amplifier is held to the precharge level, forcing the sense amplifier to a known state independent of the previously written data to that address. Furthermore, the bit-lines are precharged to a fixed potential in a conduction path through the bit-switches, rather than through local precharge devices at the sense amplifier. To write, bit-switches and write path transistors apply the fixed potential to either the true bit-line or the complement bit-line. The bit-switches on other memory cells not being written are non-conductive so as to isolate those other memory cells when setting the sense amplifiers, such that the stored contents thereof are refreshed (i.e., written back) at the same time the selected memory cell is written. Additional details regarding this early write approach may be found in U.S. Pat. No. 6,400,629 to Barth, et al. (the '629 patent), assigned to the assignee of the present application and incorporated herein by reference.

Although the early write patent improves upon the write portion of the cycle time by not having to wait until completion of signal amplification in the sense amplifiers, there is still a limit to the cycle time in writing opposite data as reflected by the signal development portion of the write cycle. Since the written cell starts at the precharge level, it will still take longer to write-back than a refreshing cell since the refreshing cell will not completely discharge prior to amplification. Accordingly, it would be desirable to be able to further improve the speed at which data is written by not having to wait for signal development in the first place.

SUMMARY OF INVENTION

The foregoing discussed drawbacks and deficiencies of the prior art are overcome or alleviated by a control circuit for a memory array device having one or more memory storage cells associated therewith. In an exemplary embodiment, the control circuit includes a true bit-line and a complementary bit-line coupled to the one or more memory storage cells. A sense amplifier is coupled to the true and complementary bit-lines, the sense amplifier being configured to amplify a small voltage difference between the true bit-line and the complementary bit-line to a full level signal at predetermined high and low logic voltage levels. A bit-switch pair selectively couples the bit-lines and said sense amplifier to fan-in circuitry, and is further configured so as to couple the fan-in circuitry to the true and complementary bit-lines prior to the activation of a word-line associated with a selected cell for a write operation thereto. Thereby, the write operation to the selected cell is commenced prior to the completion of time associated with signal development on the true and complementary bit-lines.

In another aspect, a dynamic random access memory array architecture includes a plurality of bit-line pairs coupled to a fan-in node, the plurality of bit-line pairs each including a true bit-line and a complementary bit-line coupled to one or more memory storage cells associated with the memory array. A sense amplifier is coupled to each of the plurality of bit-line pairs, the sense amplifier configured to amplify a small voltage difference between an associated true and complementary bit-line to a full level signal at predetermined high and low logic voltage levels. A plurality of bit-switch pairs is associated with each bit-line pair, the bit-switch pairs configured for selectively coupling the bit-line pairs and the sense amplifiers to the fan-in node. Each bit-switch pair is further configured so as to couple the fan-in node to the bit-line pair associated therewith prior to the activation of a word-line associated with a selected cell for a write operation thereto, thereby commencing the write operation to the selected cell prior to the completion of time associated with signal development on the bit-line pair.

In still another aspect, a method for implementing a direct write operation to a selected storage cell of a dynamic random access memory (DRAM) device includes activating a bit-switch pair so as to couple a bit-line pair to a fan-in node prior to activation of a word-line associated with the selected storage cell. The bit-line pair includes a true bit-line and a complementary bit-line coupled to a sense amplifier, the sense amplifier being configured to amplify a small voltage difference between the true and complementary bit-lines to a full level signal at predetermined high and low logic voltage levels. Once the word-line associated with the selected storage cell is activated, the write operation to the selected cell is commenced, prior to the completion of time associated with signal development on the true and complementary bit-lines.

BRIEF DESCRIPTION OF DRAWINGS

Referring to the exemplary drawings wherein like elements are numbered alike in the several Figures.

DETAILED DESCRIPTION

Disclosed herein is a system and method for implementing a direct write operation for a dynamic random access memory (DRAM) using PFET devices as bit-switches (if the bit-line pairs are precharged to ground). In this manner, the selected bit-switches may be activated prior to signal development while still isolating the fan-in node circuit capacitance since PFET devices do not pass full ground potentials. Thereby, the writeback operation begins as soon as the associated word-line signal is active and the access transistor of the particular memory cell is rendered conductive.

Figure 1:
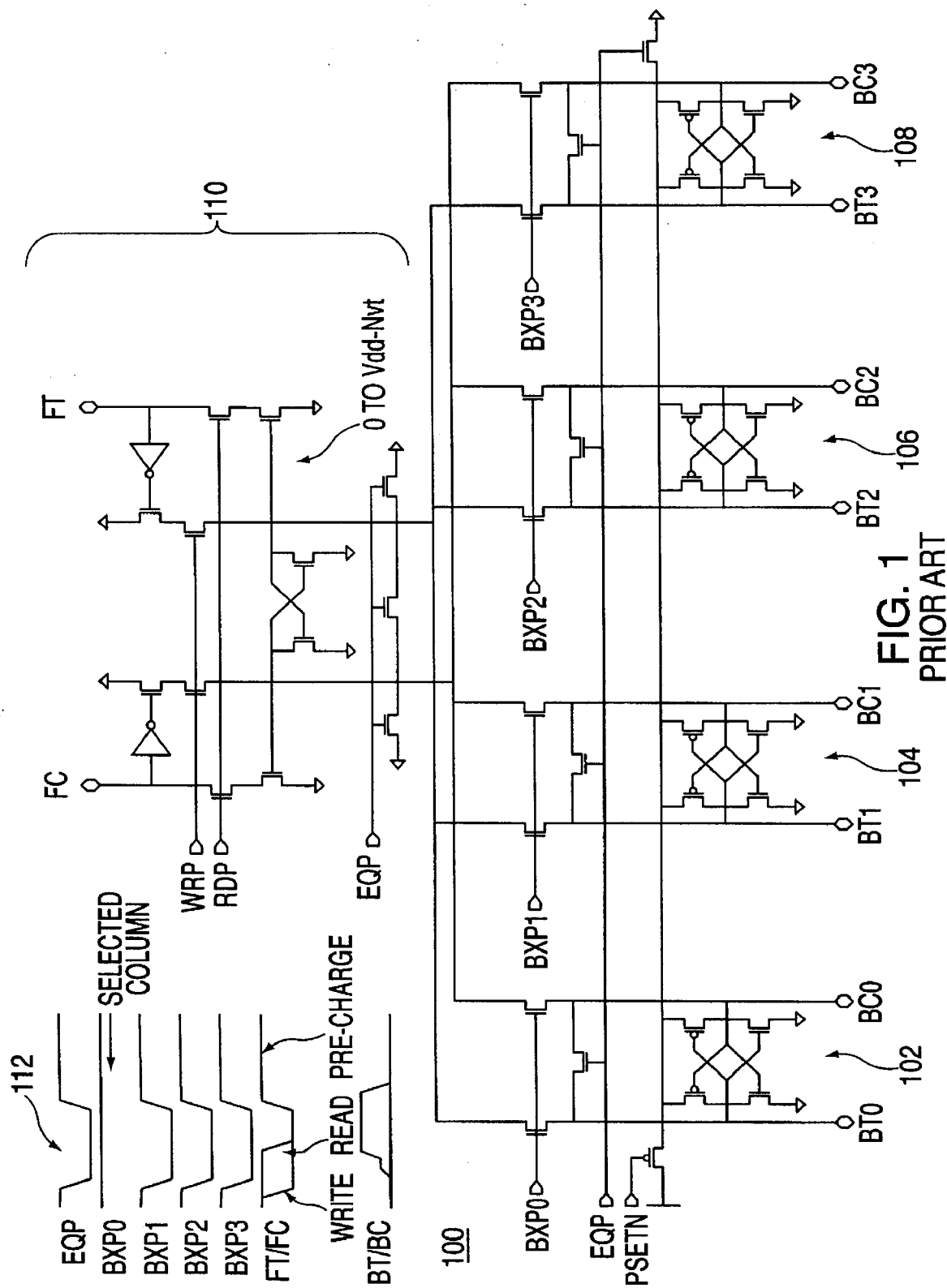
FIG. 1 is a schematic diagram of an existing, early write sense amplifier architecture for a dynamic random access memory (DRAM) device.

Referring initially to FIG. 1, there is shown a schematic diagram of an early write sense amplifier architecture 100, similar to that presented in the '629 patent referenced earlier. As is shown, the early write architecture 100 includes a primary group of sense amplifiers 102, 104, 106, 108, that are coupled to a respective pair of true/complementary bit-lines controlled by signals designated BT0/BC0, BT1/BC1, BT2/BC2, BT3/BC3. The bit-line pairs each include a true bit-line (BT) (to which the individual storage cells are selectively coupled through access transistors activated by a word-line) and a complementary bit-line (BC), which is similarly connected to a second set of individual storage cells.

Each of the bit-line pairs BT0/BC0, BT1/BC1, BT2/BC2, BT3/BC3, are selectively coupled to a fan-in node 110 through corresponding pairs of bit-switches controlled by signals designated BXP0, BXP1, BXP2, BXP3. For purposes of illustration, there are four sets of bit-line pairs and sense amplifiers configured in conjunction with the fan-in node 100. However, it will be recognized by one skilled in the art that a different number of bit-line pair/sense amplifier sets may be used. In the early write configuration of FIG. 1, the fan-in node 110 includes a true data-line FT and a complementary data-line FC used to either receive read data from a cell or to transmit write data to a cell.

The bit-switches determine which one of the four bit-line pairs is to be written during a write operation by providing a conducting path to a fixed potential (e.g., ground) for either the true bit-line or the complementary bit-line, such that this fixed potential is present at the primary sense amplifier when it sets (i.e., amplifies). For each pair of bit-switches, only one pair is turned on at a time by one of the signals BXP0 ... BXP3 so as to permit signal flow onto the corresponding true and complementary bit-lines during a write operation, and away from the true bit-line and complementary bit-line to the read buffer during a read operation. The timing of these operations is controlled by appropriate inputs on the control lines labeled EQP, WRP, RDP and PSETN. The inset timing diagram 112 demonstrates the early write operation with respect to the selected bit-switch (BXP0 in this case).

In addition to controlling which sense amplifiers are activated for read/write operations, the bit-switches are also used to precharge the true and complementary bit-lines without using precharge devices located at the primary sense amplifiers. Instead, the precharge operation is carried by turning on all of the bit-switches at a time when the fan-in circuitry is connected to a precharge potential such as ground. Thus, the bit-switches provide a conduction path for precharging the bit-lines.

When a "0" is to be written to a particular memory cell accessed by, for example bit-line BT0, the NFET transistors coupled to WRP are rendered conductive by a high-going signal thereupon. Because FT carries a low signal (representing the "0" to be written), the output of the inverter coupled to FT is high, thereby creating a conductive path to ground for BT0 once the bit-switch NFET pair is turned on by the BXP0 signal. Therefore, since the BT0 leg of sense amplifier 102 is held at ground, the activation of BXP0 need not be delayed until such time that the sense amplifier sets after activation of the word-line (not shown). Because BT0 is held at ground, BC0 will then be driven to the predetermined high voltage (i.e., $V_{dd}$). Conversely, when a "1" is to be written to a memory cell accessed by bit-line BT0, the logic 0 signal present on FC will (upon activation of WRP and BXP0) create a path to ground on BC0. Accordingly, the sense amplifier will drive bit-line BT0 to the full rail voltage that will charge the storage cell coupled thereto when the word-line is selected.

A write operation on one bit-line (e.g., bit-line BT0) occurs at the same time, and in about as little time as a refresh (writeback) operation on other bit-lines coupled to the same activated word-line. Bit-lines BT0, BT1, BT2 and BT3 are coupled to memory cells that are all accessed by the same word-line. Thus, when a particular memory cell on bit-line BT0 is being written with a new data bit, the data in memory cells on the other bit-lines BT1, BT2 and BT3 are refreshed (i.e., written back). When the word-line is activated, the charge stored in each memory cell along that word-line flows onto the bit-lines to sense amplifiers. Thus, upon word-line activation, signals representing stored data travel from the memory cells onto bit-lines BT0 through BT3 or BC0 through BC3 to primary sense amplifiers 102 through 108, respectively.

In a write operation such as described above, only the memory cell on bit-line BT0 is written because only the BXP0 bit-switch pair is turned on at that time. The memory cells on bit-lines BT1 through BT3 are not written but are instead written back because the primary sense amplifiers 104, 106, 108 still receive the stored data signals from the bit-lines coupled thereto and regenerate the data signals to the predetermined high and low logic levels. These levels are then stored again to the memory cells through the still activated word-line.

As stated previously, the configuration of architecture 100, among other aspects, allows for early write as a result of the clamping of one of the bit-lines to ground. However, as also indicated previously, this operation still must wait until signal development on the bit-lines and is therefore still dependent on the write cycle to a certain extent. In one respect, activating a bit-switch pair prior to signal development results in the coupling of the fan-in node capacitance to the bit-lines, since NFET devices are used for the bit-switches and since the bit-lines are precharged to ground by the fan-in circuitry. As such, this added capacitance would adversely affect the charge transfer ratio from the cell to the bit-line and thus reduce final signal level on the sense amplifier. This reduced signal level would typically translate into a longer required cycle time or a fail in the sense amplifier. In another respect, notwithstanding the capacitive coupling problem, the immediate coupling of write data onto a bit-line (before or during signal development on adjacent bit-lines) renders the adjacent bit-lines susceptible to noise as a result of the common sense amplifier set bus activated by turning on the transistor coupled to PSETN. This, in effect, would set or amplify the refreshing sense amplifiers prior to completion of signal development.

Figure 2:
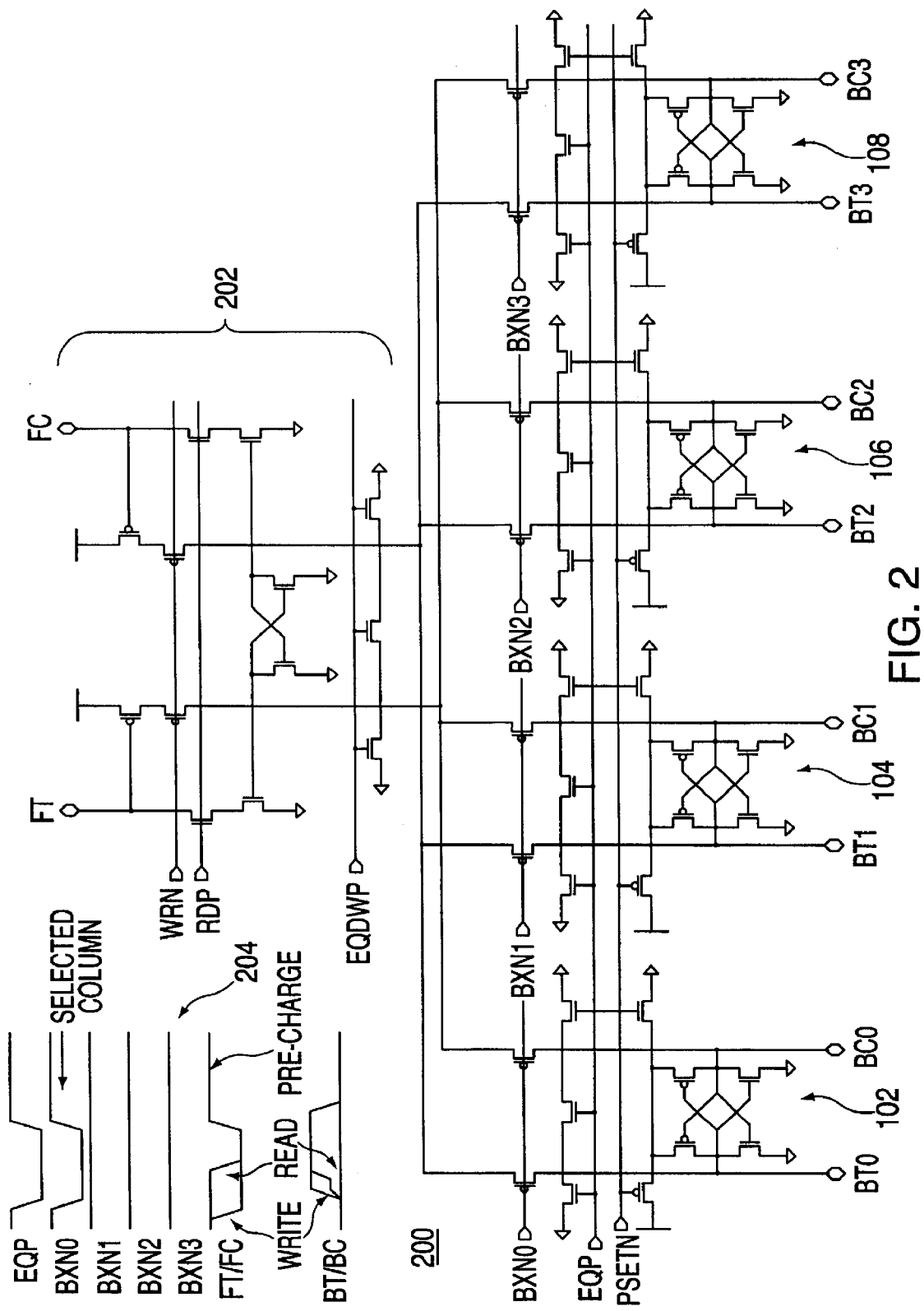
FIG. 2 is a schematic diagram of a direct write sense amplifier architecture for a memory array device, in accordance with an embodiment of the invention.

Therefore, in accordance with an embodiment of the invention, FIG. 2 illustrates a schematic diagram of a "direct write" sense amplifier architecture 200, in which the bit-switches BXP0 through BXP3 are embodied by PFET devices. Because the bit-lines are still precharged to ground (as with the conventional and early write schemes), the fact that the bit-switches are rendered conductive prior to signal development does not have the effect of coupling capacitance from the fan-in lines circuitry. Stated more generally, the operating polarity of the bit-switches are of opposite polarity of the devices which engage the precharging operation. Thus, if the bit-lines were to be precharged to $V_{dd}$ (and activated by PFETs), then the bit-switches would be embodied by NFET devices. During signal development, as long as the charge transfer generates less than a PFET device threshold on the bit-line, the PFET will remain off, isolating the fan node capacitance during refresh and read operations.

For purposes of simplicity, like elements as those described FIG. 1 are labeled with the same reference numerals in FIG. 2. As is shown in FIG. 2, the sense amplifiers 102, 104, 106, 108 corresponding to bit-line pairs BT0/BC0, BT1/BC1, BT2/BC2, BT3/BC3 are selectively coupled to fan-in node 202 through PFET bit-switch pairs BXN0, BXN1, BXN2, BXN3, respectively. It will also be noted that the write control signal WRN is active low, as it is coupled to pull-up PFET devices, as are the true and complement data lines FT, FC in the fan-in node 202.

In contrast to the early write architecture 100 of FIG. 1, the novel direct write architecture 200 of FIG. 2 allows for the commencement of the write operation as soon as the appropriate word-line is activated for the selected bit-line. This is a result of the fact that the bit-switch pair (e.g., BXN0) may be activated even prior to signal development on the bit-lines, and without coupling additional capacitance on the selected bit-lines. Because the bit-switches are PFET devices, they will not pass ground potential therethrough, which is still the voltage level used to precharge the bit-lines as seen by the control signals EQP and EQDWP. Stated more generally, the bit-switch device polarity (e.g., PFET) is chosen to be the opposite polarity as the devices used to carry out the precharge (e.g., NFET). Thus, if the architecture 200 were configured in a manner so as to charge the bit-lines to $V_{dd}$, then the bit-switches would be implemented by NFETs, since those devices do not pass $V_{dd}$ therethrough.

Because a write operation begins immediately upon word line activation, the noise issue on adjacent bit-lines is addressed by utilizing separate PSET buses for each bit-line pair, as also shown in FIG. 2. With the use of isolated PSET buses, it is preferable to interleave the sense amplifier layout. It will be noted, however, that each PSET bus is activated by a common signal, PSETN. As will also be noted, the bit-switches are not used in this architecture to precharge the bit-lines. Instead, precharging is controlled by the signal EQP that, in addition to shorting the bit-line pairs together, couples each bit-line pair to ground through dedicated NFET devices. The bit-switches can no longer be used to initiate precharge since they do not pass a full precharge level.

It should also be noted that the direct write architecture 200 will assert a full level signal on the bit-lines during the signal development of neighboring sense amplifiers and associated bit-lines. Besides the PSET issue, which is resolved via isolated PSET nodes, bit-line coupling issues must also be addressed. In a preferred embodiment, bit-line twisting is used to convert all noise to due to coupling into common mode noise on the bit-lines. That is, any coupling effects seen on a neighboring true bit-line are also seen in equal amount by the corresponding complement bit-line. This removes the need to delay the direct write until after signal development due to line-to-line coupling.

The timing diagram insert 204 reflects the additional time saved by the direct write configuration. During a write operation, either the true or complement bit-line rises to the logic high level even prior to the signal development phase that occurs during a read/writeback operation. For example, for a direct write of a "0" bit to a selected cell coupled to BT0, the bit-switch pair BXN0 is rendered conductive, prior to word-line activation, while the unselected bit-switches remain off. When WRN is activated by a low-going signal thereupon, the ground potential data signal on FT causes BC0 to immediately be pulled up to $V_{dd}$. In addition, this causes the cross-coupled NFET of the fan-in circuitry 202 to pull the BT0 bit-line to ground for a full low-level bit-line write. The PFET bit-switches in this case allow for a full $V_{dd}$ level to be written to the sense amplifier. Thus, the written sense amplifier bit-lines are amplified to full and opposite levels prior to normal read or refresh amplification.

Not only does the above described architecture 200 provide improved cycle time during write operations, there are also benefits associated with an improved read performance. For example, using architecture 200, there is no gating signal that need be activated once the sense amplifier sets to read out the data. In other words, during a read operation, data stored within a selected cell is coupled to the fan-in circuitry once the signal voltage developed on the applicable bit-line pair reaches the voltage threshold level of the bit-switch PFET device.

A conventional DRAM sense amp design activates the read bit-switches only after the sense amp sets. This is done to ensure the sense amp operation is not corrupted by coupling a read path or read latch to the sense amp prior to setting. The delay that is placed between the sense amp setting and the read switch activation represents a read access penalty in these architectures. In contrast, the present disclosure addresses and fixes this problem by allowing the read/write bit-switch to be open prior to sense amp setting such that, as soon as amplification begins, the particular bit-line that is to be pulled to $V_{DD}$ will transfer through the PFET onto a read NFET. As this NFET turns on, it pulls a read data line (that was precharged to $V_{DD}$) to GND. This is a non-gated operation yielding immediate access after sense amp set. The read path is true/complement for this design, and only the true or complement data line will pull low since only one fan in node will pull high.

Secondly, (and as is the case with direct write) the use of PFET bit-switches allows for a full level $V_{DD}$ on a read operation. For robust operation, especially at low voltages, it is desirable to drive a full $V_{DD}$ level on the NFET pull-down device connected to the fan node. Since the bit-switch is a PFET, the sense amp will always drive a full $V_{DD}$ level to the fan node and thus the NFET gate. On the other hand, if the bit switch were an NFET, the read NFET pull down device would see only a partial $V_{DD}$ level ($V_{DD}$-Vt), which yields partial overdrive and reduced performance in the read path.

It will thus be appreciated that the direct write architecture 200 provides an improved cycle time by directly writing both the true and complementary bit-lines prior to signal development thereon. More specifically, cycle time is improved by not waiting until normal set time to writeback the cell from the precharge level to the opposite state. Because the write cycle time overhead (e.g., about 200 ps–400 ps) is removed, the overall cycle time is limited only by the refresh cycle. As stated earlier, although refresh starts write back at normal sense amplifier set time, the cell is not fully discharged during signal development, thus allowing full write back to occur sooner than in the early write cycle case. This is in contrast to the fan-in circuitry 110 of the early write architecture 100, wherein the NFET bit-switches are only used to clamp one leg of the sense amplifier to the precharge level. The other leg of the sense amplifier is left to float, requiring the cross coupled PFETs to amplify the high level bit-line at set time. If the NFET bit-switches were used to write both legs of the sense amp, the non-isolated PSET busses would pre-amplify, thus failing the refreshing sense amplifiers as described earlier.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A control circuit for a memory array device having one or more memory storage cells associated therewith, comprising:

a true bit-line and a complementary bit-line coupled to the one or more memory storage cells;

a sense amplifier coupled to said true and complementary bit-lines, said sense amplifier configured to amplify a small voltage difference between said true bit-line and said complementary bit-line to a full level signal at predetermined high and low logic voltage levels; and a bit-switch pair for selectively coupling said bit-lines and said sense amplifier to fan-in circuitry, said bit-switch pair further configured so as to couple said fan-in circuitry to said true and complementary bit-lines prior to the activation of a word-line associated with a selected cell for a write operation thereto, thereby commencing said write operation to said selected cell prior to the completion of time associated with signal development on said true and complementary bit-lines.

2. The control circuit of claim 1, wherein:

said true and complementary bit-lines are precharged at a first logic level through activation of switching devices of a first polarity type; and said bit-switch pair comprises switching devices of a second polarity type opposite said first polarity type.

3. The control circuit of claim 2, wherein:

said true and complementary bit-lines are precharged to ground potential through NFET devices; and said bit-switch pair comprises PFET devices.

4. The control circuit of claim 1, wherein said sense amplifier is coupled to a set bus, wherein said set bus is electrically isolated from additional sense amplifiers associated with additional bit-line pairs.

5. The control circuit of claim 1, wherein said bit-switch pair is configured to isolate said true and complementary bit-lines from additional bit-line capacitance associated with said fan-in circuitry, regardless of whether said bit-switch pair is activated or deactivated.

6. The control circuit of claim 1, wherein during said write operation, one of said true and complementary bit-lines is written to a full low level voltage and the other of said true and complementary bit-lines is written to a full high level voltage.

7. The control circuit of claim 3, wherein during a read operation, data stored within a selected cell is coupled to said fan-in circuitry once said small voltage difference between said true bit-line and said complementary bit-line reaches the voltage threshold level of said PFET devices used for said bit-switch pair.

8. The control circuit of claim 1, wherein during a read operation, said fan-in circuitry senses from one of said true and complementary bit-lines a full high level voltage equivalent to the voltage of a supply source, $V_{dd}$.

9. A dynamic random access memory array architecture, comprising:

a plurality of bit-line pairs coupled to a fan-in node, said plurality of bit-line pairs each including a true bit-line and a complementary bit-line coupled to one or more memory storage cells associated with the memory array;

a sense amplifier coupled to each of said plurality of bit-line pairs, said sense amplifier configured to amplify a small voltage difference between an associated true and complementary bit-line to a full level signal at predetermined high and low logic voltage levels; and a plurality of bit-switch pairs associated with each bit-line pair, said bit-switch pairs for selectively coupling said bit-line pairs and said sense amplifiers to said fan-in node, each said bit-switch pair further configured so as to couple said fan-in node to said bit-line pair associated therewith prior to the activation of a word-line associated with a selected cell for a write operation thereto, thereby commencing said write operation to said selected cell prior to the completion of time associated with signal development on said bit-line pair.

10. The memory array architecture of claim 8, wherein:

said bit-line pairs are precharged at a first logic level through activation of switching devices of a first polarity type; and said bit-switch pairs comprise switching devices of a second polarity type opposite said first polarity type.

11. The memory array architecture of claim 10, wherein:

said bit-line pairs are precharged to ground potential through NFET devices; and said bit-switch pairs comprise PFET devices.

12. The memory array architecture of claim 9, wherein each of said sense amplifiers is coupled to a corresponding plurality of individual set buses, wherein each set bus is electrically isolated from one another.

13. The memory array architecture of claim 9, wherein said bit-switch pairs are configured to isolate said bit-line pairs associated therewith from additional bit-line capacitance associated with said fan-in circuitry, regardless of whether an individual bit-switch pair is activated or deactivated.

14. The memory array architecture of claim 9, wherein during said write operation, one of said true and complementary bit-lines is written to a full low level voltage and the other of said true and complementary bit-lines is written to a full high level voltage.

15. The memory array architecture of claim 11, wherein during a read operation, data stored within a selected cell is coupled to said fan-in circuitry once said small voltage difference between said true bit-line and said complementary bit-line reaches the voltage threshold level of said PFET devices used for said bit-switch pair.

16. The memory array architecture of claim 9, wherein during a read operation, said fan-in circuitry senses from one of said true and complementary bit-lines a full high level voltage equivalent to the voltage of a supply source, $V_{dd}$.

17. A method for implementing a direct write operation to a selected storage cell of a dynamic random access memory (DRAM) device, the method comprising:

activating a bit-switch pair so as to couple a bit-line pair to a fan-in node prior to activation of a word-line associated with the selected storage cell; and said bit-line pair comprising a true bit-line and a complementary bit-line coupled to a sense amplifier, said sense amplifier configured to amplify a small voltage difference between said true and complementary bit-lines to a full level signal at predetermined high and low logic voltage levels;

wherein once the word-line associated with the selected storage cell is activated, the write operation to the selected cell is commenced, prior to the completion of time associated with signal development on said true and complementary bit-lines.

18. The method of claim 17, further comprising:

precharging said true and complementary bit-lines at a first logic level through activation of switching devices of a first polarity type;

wherein said bit-switch pair comprises switching devices of a second polarity type opposite said first polarity type.

19. The method of claim 18, wherein:

said true and complementary bit-lines are precharged to ground potential through NFET devices; and said bit-switch pair comprises PFET devices.

20. The method of claim 17, wherein said sense amplifier is coupled to a set bus, wherein said set bus is electrically isolated from additional sense amplifiers associated with additional bit-line pairs.

21. The method of claim 17, wherein said bit-switch pair is configured to isolate said true and complementary bit-lines from additional bit-line capacitance associated with said fan-in circuitry, regardless of whether said bit-switch pair is activated or deactivated.

22. The method of claim 17, wherein during said write operation, one of said true and complementary bit-lines is written to a full low level voltage and the other of said true and complementary bit-lines is written to a full high level voltage.

23. The method of claim 19, wherein during a read operation, data stored within a selected cell is coupled to said fan-in circuitry once said small voltage difference between said true bit-line and said complementary bit-line reaches the voltage threshold level of said PFET devices used for said bit-switch pair.

24. The method of claim 17, wherein during a read operation, said fan-in circuitry senses from one of said true and complementary bit-lines a full high level voltage equivalent to the voltage of a supply source, $V_{dd}$.

* * * * *